US009147745B2

(12) United States Patent
Zhu et al.

(10) Patent No.: US 9,147,745 B2
(45) Date of Patent: Sep. 29, 2015

(54) SEMICONDUCTOR DEVICES FORMED USING A SACRIFICIAL LAYER AND METHODS FOR MANUFACTURING THE SAME

(75) Inventors: Huilong Zhu, Poughkeepsie, NY (US); Qingqing Liang, Lagrangeville, NY (US); Huicai Zhong, San Jose, CA (US); Hao Wu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 10 days.

(21) Appl. No.: 13/981,808

(22) PCT Filed: Jul. 24, 2012

(86) PCT No.: PCT/CN2012/079081
§ 371 (c)(1),
(2), (4) Date: Jul. 25, 2013

(87) PCT Pub. No.: WO2014/012263
PCT Pub. Date: Jan. 23, 2014

(65) Prior Publication Data
US 2014/0110756 A1 Apr. 24, 2014

(30) Foreign Application Priority Data

Jul. 17, 2012 (CN) .......................... 2012 1 0247385

(51) Int. Cl.
*H01L 29/66* (2006.01)
*H01L 29/78* (2006.01)
(Continued)

(52) U.S. Cl.
CPC ...... *H01L 29/66477* (2013.01); *H01L 21/2815* (2013.01); *H01L 29/66545* (2013.01);
(Continued)

(58) Field of Classification Search
CPC .................................... H01L 29/66477
USPC .......................................... 257/192
See application file for complete search history.

(56) References Cited

U.S. PATENT DOCUMENTS 6,380,045 B1 * 4/2002 Guo .............................. 438/396
2001/0025995 A1 * 10/2001 Lee et al. ...................... 257/382
(Continued)

FOREIGN PATENT DOCUMENTS

CN 1692473 11/2005
CN 1897234 1/2007
(Continued)

OTHER PUBLICATIONS

International Search Report for PCT Application No. PCT/CN2012/079081, dated Apr. 25, 2013, 5 pages.
(Continued)

*Primary Examiner* — Ajay K Arora
(74) *Attorney, Agent, or Firm* — Westman, Champlin & Koehler, P.A.

(57) ABSTRACT

Semiconductor devices and methods for manufacturing the same are disclosed. In one embodiment, the method comprises: sequentially forming a sacrificial layer and a semiconductor layer on a substrate; forming a first cover layer on the semiconductor layer; forming an opening extending into the substrate with the first cover layer as a mask; selectively removing at least a portion of the sacrificial layer through the opening, and filling an insulating material in a gap due to removal of the sacrificial layer; forming one of source and drain regions in the opening; forming a second cover layer on the substrate; forming the other of the source and drain regions with the second cover layer as a mask; removing a portion of the second cover layer; and forming a gate dielectric layer, and forming a gate conductor in the form of spacer on a sidewall of a remaining portion of the second cover layer.

20 Claims, 6 Drawing Sheets

(51) Int. Cl.
*H01L 29/786* (2006.01)
*H01L 21/28* (2006.01)
*H01L 29/51* (2006.01)

(52) U.S. Cl.
CPC ...... *H01L29/66772* (2013.01); *H01L 29/7848* (2013.01); *H01L 29/78618* (2013.01); *H01L 29/78639* (2013.01); *H01L 29/78654* (2013.01); *H01L 29/517* (2013.01); *H01L 29/66628* (2013.01); *H01L 29/66636* (2013.01)

(56) References Cited

U.S. PATENT DOCUMENTS

| | | |
|---|---|---|
| 2003/0032295 A1 | 1/2003 | Assaderaghi et al. |
| 2006/0115941 A1* | 6/2006 | Shin ............................ 438/197 |
| 2007/0063248 A1 | 3/2007 | Huang et al. |
| 2007/0202644 A1 | 8/2007 | Monfray et al. |
| 2012/0043624 A1* | 2/2012 | Liang et al. .................. 257/410 |

FOREIGN PATENT DOCUMENTS

| | | |
|---|---|---|
| CN | 102239562 | 11/2011 |
| CN | 102376769 | 3/2012 |

OTHER PUBLICATIONS

Written Opinion for International Search Report for PCT Application No. PCT/CN2012/079081, dated Apr. 25, 2013, 5 pages.

* cited by examiner

SEMICONDUCTOR DEVICES FORMED USING A SACRIFICIAL LAYER AND METHODS FOR MANUFACTURING THE SAME

CROSS-REFERENCE TO RELATED APPLICATION

This Application is a Section 371 National Stage Application of International Application No. PCT/CN2012/079081, filed 24 Jul. 2012, in Chinese, the contents of which are hereby incorporated by reference in their entirety.

CROSS-REFERENCE TO RELATED APPLICATION(S)

This application claims priority to Chinese Application No. 2012102447385.2, entitled "SEMICONDUCTOR DEVICES AND METHODS FOR MANUFACTURING THE SAME," filed on Jul. 17, 2012, which is incorporated herein by reference in their entirety.

TECHNICAL FIELD

The present disclosure relates to the semiconductor field, and particularly, to semiconductor devices and methods for manufacturing the same.

BACKGROUND

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by means of the replacement gate process. The replacement gate process involves filling the high-K dielectric and the metal gate conductor in a gap defined between gate spacers. However, it is becoming more and more difficult to fill the high-K dielectric and the metal gate conductor in the small gap due to the scaling down of the semiconductor devices.

On the other hand, semiconductor devices formed on Extremely Thin Semiconductor On Insulator (ET-SOI) substrates have good control of the short channel effects and relatively small random fluctuation of dopants. However, the ET-SOI substrates are expensive in cost.

SUMMARY

The present disclosure provides, among others, semiconductor devices and methods for manufacturing the same.

According to an aspect of the present disclosure, there is provided a method for manufacturing a semiconductor device, comprising: sequentially forming a sacrificial layer and a semiconductor layer on a substrate; forming a first cover layer on the semiconductor layer; forming an opening extending into the substrate with the first cover layer as a mask; selectively removing at least a portion of the sacrificial layer through the opening, and filling an insulating material in a gap due to removal of the sacrificial layer; forming one of source and drain regions in the opening; forming a second cover layer on the substrate; forming the other of the source and drain regions with the second cover layer as a mask; removing a portion of the second cover layer; and forming a gate dielectric layer, and forming a gate conductor in the form of spacer on a sidewall of a remaining portion of the second cover layer According to a further aspect of the present disclosure, there is provided a semiconductor device, comprising: a substrate; a buried insulator layer on the substrate; a semiconductor layer on the buried insulator layer; and source and drain regions and a gate stack formed on the substrate, wherein the gate stack comprises: a gate dielectric layer; and a gate conductor, which is formed in the form of spacer on a sidewall of a dielectric layer or a gate spacer being adjacent to the gate stack.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
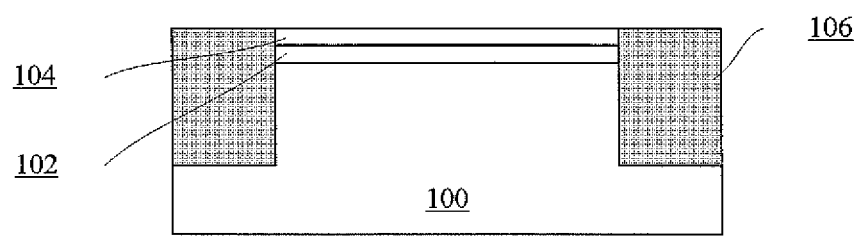
FIGS. 1-12 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In the conventional process, after source and drain regions are formed in a substrate with the aid of a "dummy" gate stack and spacers on opposite sides of the dummy gate stack, the spacers are reserved to define a gap therebetween, and a true gate stack can be formed by filling the gap. In contrast, the present disclosure proposes a "replacement spacer" process. Specifically, after source and drain regions are formed, material layer(s) present on the side of either one of the source and drain regions is (are) reserved, and a gate stack (particularly, a gate conductor) is formed in the form of spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gap between the spacers.

According to embodiments of the present disclosure, the source and drain regions can be formed in an active region of the substrate by means of cover layers. For example, the active region may be shielded with a first cover layer to expose a portion thereof, which may be processed to form one of the source and drain regions. Further, the active region may be shielded with a second cover layer to expose a further portion thereof, which may be processed to form the other of the source and drain regions.

Such first and second cover layers may be formed in various ways, provided that they can shield the active region and thus expose the respective portions of the active region. In this way, the cover layers serve as masks in the source/drain formation process. Further, the second cover layer may comprise some portion(s) from the first cover layer.

After the source and drain regions are formed as stated above, the second cover layer may be patterned, so that a portion thereof is removed to expose a still further portion of the active region, on which the gate stack can be formed. For example, the gate stack may be formed by a spacer formation process. For convenience of patterning the second cover layer, the second cover layer may comprise several portions of different materials, among which at least some portions have etching selectivity with respect to each other so that some of them can be selectively removed.

Further, according to embodiments of the present disclosure, a buried insulator layer can be defined by a sacrificial layer. For example, a sacrificial layer and a semiconductor layer can be formed sequentially on the substrate. Then, an opening can be formed to expose the sacrificial layer so as to selectively remove at least a portion of the sacrificial layer. The buried insulator layer can be formed by filling an insulating material into a gap due to removal of the sacrificial layer.

Formation of such a buried insulator layer can be combined with the replacement spacer process. For example, the opening can be formed with the first cover layer as a mask, and the buried insulator layer can be formed via the opening. Then, semiconductor material(s) can be formed (by means of, e.g., epitaxy) in the opening to form the source or drain region.

The technology of the present disclosure can be implemented in various ways, some of which will be described in the following by way of example.

As shown in FIG. 1, a substrate 100 is provided. The substrate 100 may comprise any suitable substrate, including, but not limited to, a bulk semiconductor substrate such as a bulk Si substrate, a SiGe substrate, and the like. In the following, the substrate is described as a bulk Si substrate for convenience.

On the substrate 100, a sacrificial layer 102 and a semiconductor layer 104 are sequentially formed by means of, e.g., epitaxy. For example, the sacrificial layer 102 may comprise SiGe (where Ge may have an atomic percentage of about 10-30%), with a thickness of about 10-50 nm. The semiconductor layer 104 may be same as or different from the substrate 100 in component. In this example, the semiconductor layer 104 comprises Si, with a thickness of about 5-30 nm.

Further, on the substrate 100, Shallow Trench Isolations (STIs) 106 can be formed to isolate active regions of individual devices. For example, the STIs 106 may comprise oxide (e.g., silicon oxide). In the following, formation of a single one device is described for convenience. However, it is to be noted that the present disclosure is not limited thereto, and is also applicable to formation of two or more devices.

Optionally, a thin oxide layer (not shown) may be formed on a surface of the semiconductor layer 104 by means of e.g. deposition. For example, the oxide layer may have a thickness of about 5-10 nm, and can be used to form an Interfacial Layer (IL) subsequently.

Figure 2:
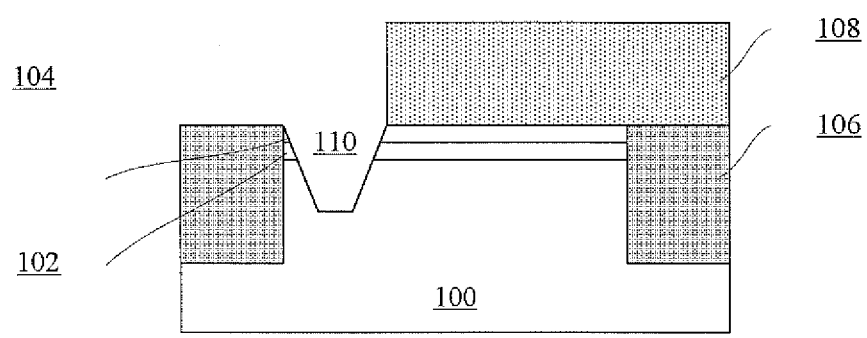

Next, as shown in FIG. 2, on the semiconductor layer 104, a first cover layer 108 with a thickness of e.g. about 100-200 nm can be formed by means of e.g. deposition. For example, the first cover layer 108 may comprise nitride (e.g. silicon nitride). The first cover layer 108 can be patterned by means of e.g. Reactive Ion Etching (RIE) to cover a portion of the active region (which portion substantially corresponds to a later formed source or drain region plus a channel region). Then, one of the source and drain regions can be formed in an exposed portion of the active region by means of a source/drain formation process.

Specifically, an opening 110 extending into the substrate 100 can be formed by means of selective etching with the first cover layer 108 as a mask. The selective etching can be done by anisotropically etching the semiconductor layer 104 (e.g., Si) and the sacrificial layer 102 (e.g., SiGe) with an etching solution such as TMAH, KOH, EDP, and $N_2H_4 \cdot H_2O$.

Figure 3:
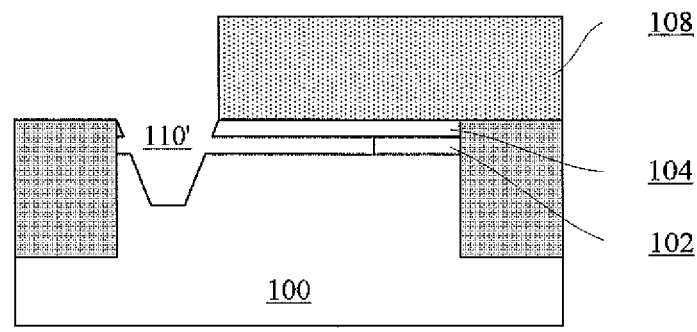
Figure 4:
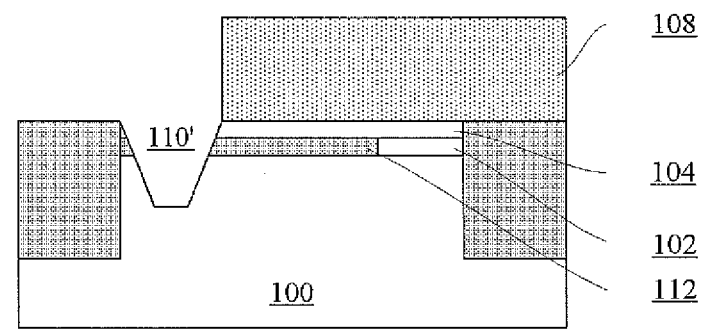

Due to formation of the opening 110, the sacrificial layer 102 is exposed. According to an embodiment of the present disclosure, a buried insulator layer may be formed by replacing the sacrificial layer 102 (entirely or partially) with an insulating material, in order to further improve the device performances. Specifically, as shown in FIG. 3, the sacrificial layer 102 (e.g., SiGe) may be selectively etched with respect to the substrate 100 and the semiconductor layer 104 (e.g., Si) by wet-etching through the opening 110, to at least partially remove the sacrificial layer 102, resulting in a gap (which gap is shown in FIG. 3 together with the opening as 110'). Preferably, the gap extends beyond a gate region to be formed to reach the source or drain region on the other side. Then, as shown in FIG. 4, oxide can be formed by means of regeneration (e.g., by oxidation in an atmosphere of oxygen) or deposition (e.g., Chemical Vapor Deposition (CVD)) and then etched back, to fill the insulating material 112 (oxide in this example) in the gap.

Figure 5:
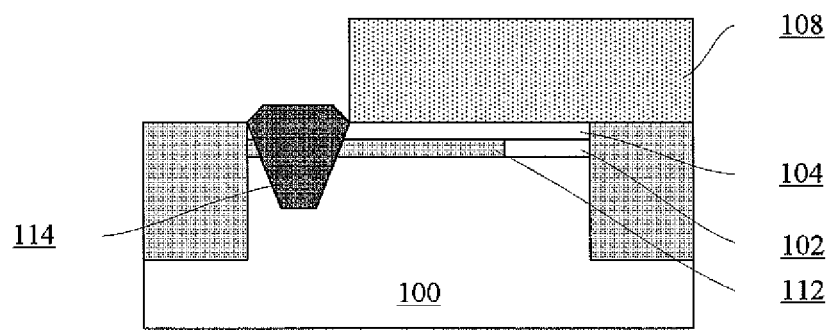

Then, as shown in FIG. 5, one of the source and drain regions 114 may be formed in the opening 110 by means of, e.g., epitaxy. For example, the one of the source and drain regions 114 may comprise a semiconductor material different in component from the semiconductor layer 104, so that stress can be applied to the channel region to be formed in the semiconductor layer 104 due to mismatch of lattice constants between these two. For a p-type device, the source/drain region 114 may be compressive-stressed; while for an n-type device, the source/drain region 114 may be tensile-stressed. For example, in the case where the semiconductor layer 104 comprises Si, the source/drain region 114 may comprise SiGe (where Ge may have an atomic percentage of about 15-75%) for a p-type device, and Si:C (where C may have an atomic percentage of about 0.2-2%) for an n-type device. The source/drain region 114 can be in-situ doped in an appropriate conductivity type while being epitaxially grown.

There are various ways to form the stressed source/drain region, and detailed descriptions thereof are omitted here.

It is to be noted that the present disclosure is not limited to formation of the stressed source/drain region. For example, the same semiconductor material (e.g., Si) as the semiconductor layer 104 may be formed in the opening 110 by epitaxy and appropriately doped to form the source/drain region.

Figure 6:
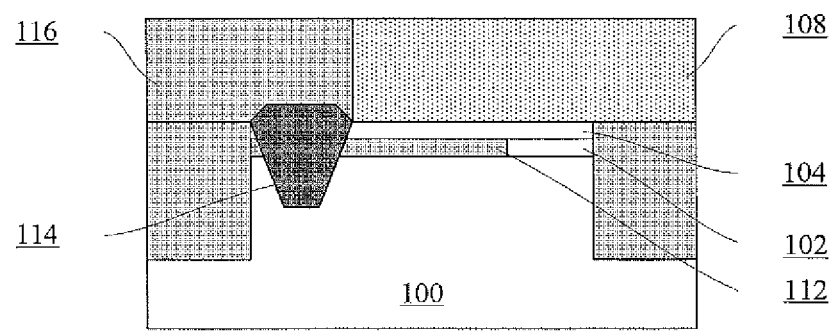

Next, as shown in FIG. 6, a second cover sub-layer 116 may be formed on the substrate 100. For example, the second cover sub-layer 116 may comprise oxide (e.g., silicon oxide). Then, a planarization process such as CMP can be performed to expose the first cover layer 108, for convenience of later processes.

Figure 7:
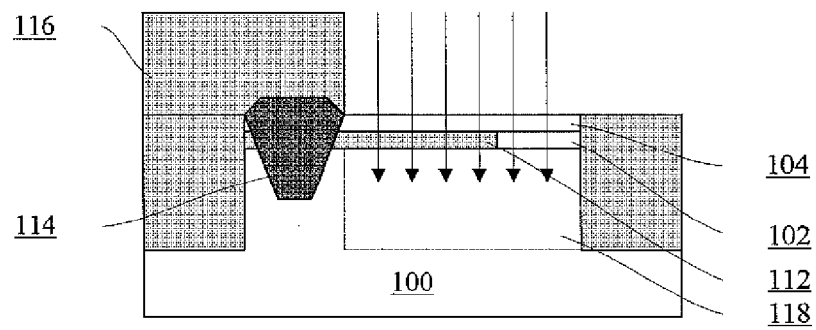

Subsequently, as shown in FIG. 7, the first cover layer 108 (e.g., silicon nitride) may be selectively etched with respect to the second cover sub-layer 116 (e.g., silicon oxide) and thus removed. The selective etching can be done by wet-etching (for example, with hot phosphoric acid) or a combination of wet-etching and RIE.

According to an embodiment of the present disclosure, well implantation (as indicated by arrows in FIG. 7) may be performed with the second cover sub-layer 116 as a mask, to form an asymmetric well 118 in the substrate 100 under the buried insulator layer 112. It is to be noted that the dashed line block 118 in FIG. 7 is shown as a regular rectangular shape for convenience of illustration. In practice, the profile of the well 118 depends on the implantation process, and may have no definite boundaries. With the asymmetric well 118, it is possible to effectively suppress punch-through effects of the device, and also to reduce band-to-band leakage. It is to be noted that formation of the well 118 is not necessary for the device.

Figure 8:
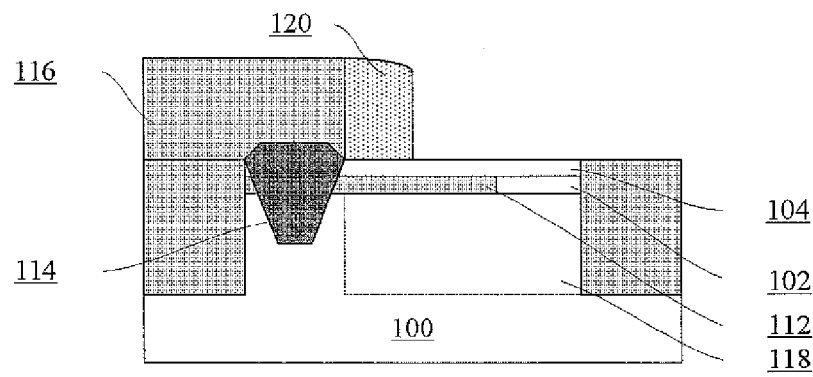

Then, as shown in FIG. 8, a spacer 120 may be formed on a sidewall of the second cover sub-layer 116. For example, the spacer 120 may be formed to have a width of about 8-30 nm, to cover a portion of the active region (which portion substantially corresponds to the later formed gate region). The spacer 120 may comprise nitride (e.g., silicon nitride), for example. There are various ways to form the spacer, and detailed descriptions on formation of the spacer are omitted here.

Thus, the second cover sub-layer 116 and the spacer 120 (constituting a second cover layer) expose a portion of the active region. Then, the other of the source and drain regions can be formed in the exposed portion of the active region by means of a source/drain formation process with the second cover layer as a mask.

Figure 9:
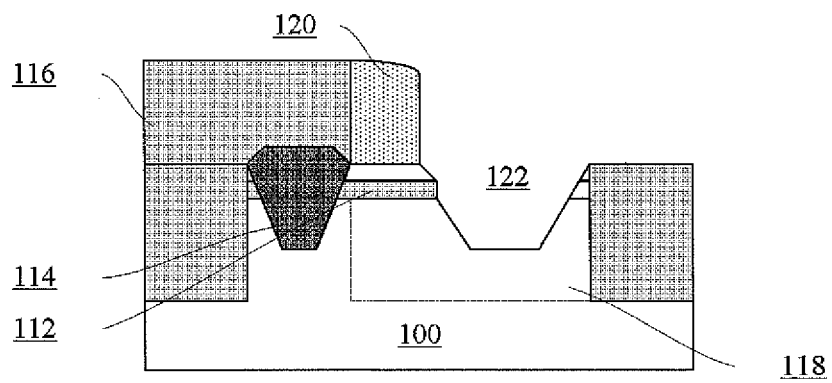
Figure 10:
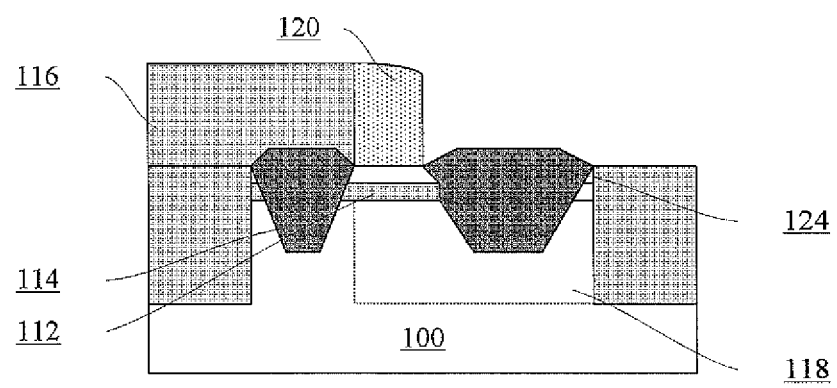

According to an embodiment of the present disclosure, a stressed source/drain region can be formed to improve the device performances. Specifically, as shown in FIG. 9, the semiconductor layer 104, the insulating material 112 which possibly exists there (due to its extension beyond the gate region), a possible remainder of the sacrificial layer 102 and the substrate 100 are selectively etched with the second cover layer (116+120) as a mask, to form an opening 122 extending into the substrate 100. For example, the semiconductor layer 104 (e.g., Si) may be anisotropically etched by means of a TMAH solution. Then, the insulating material 112 (e.g., oxide) which possibly exist there may be etched by means of RIE. After that, the possible remainder of the sacrificial layer 102 and the substrate 100 may be anisotropically etched by means of a TMAH solution. Next, as shown in FIG. 10, the other of the source and drain regions 124 may be formed in the opening 122 by means of, e.g., epitaxy. For example, the source/drain region 124 may comprise a semiconductor material different in component from the semiconductor layer 104, so that stress can be applied to the channel region to be formed in the semiconductor layer 104 due to mismatch of lattice constants between these two. For a p-type device, the source/drain region 124 may be compressive-stressed; while for an n-type device, the source/drain region 114 may be tensile-stressed. For example, in the case where the semiconductor layer 104 comprises Si, the source/drain region 124 may comprise SiGe (where Ge may have an atomic percentage of about 15-75%) for a p-type device, and Si:C (where C may have an atomic percentage of about 0.2-2%) for an n-type device. The source/drain region 124 can be in-situ doped in an appropriate conductivity type while being epitaxially grown.

There are various ways to form the stressed source/drain region, and detailed descriptions thereof are omitted here.

It is to be noted that the present disclosure is not limited to formation of the stressed source/drain region. For example, the same semiconductor material (e.g., Si) as the semiconductor layer 104 may be formed in the opening 122 by epitaxy and appropriately doped to form the source/drain region.

Subsequently, a portion of the second cover layer may be removed by means of selective etching. For example, the spacer 120 (e.g., silicon nitride) may be selectively removed by means of hot phosphoric acid. As a result, a relatively large space (substantially corresponding to the gate region+the other of the source and drain regions) is reserved on the side of the second cover sub-layer 116, so that it is easy to form a gate stack.

Figure 11:
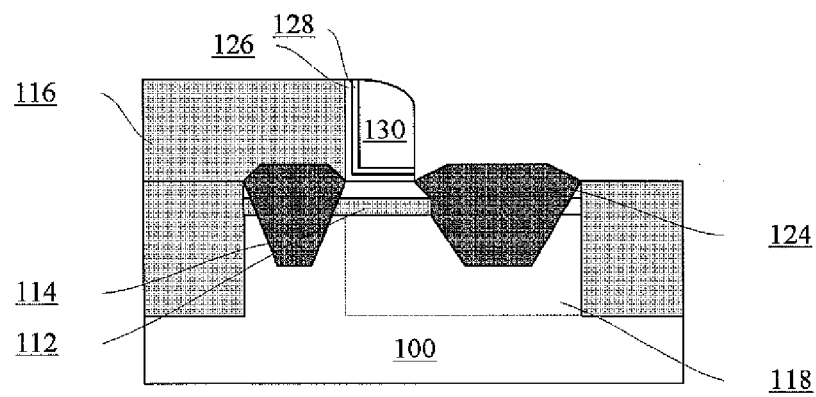

Then, as shown in FIG. 11, the gate stack can be formed. Specifically, a gate dielectric layer 126 can be formed by means of e.g. deposition. For example, the gate dielectric layer 126 may comprise a high-K gate dielectric material such as $HfO_2$, with a thickness of about 2-4 nm. On the gate dielectric layer 126, a gate conductor 130 can be formed in the form of spacer. In formation of the gate conductor, parameters adopted in the spacer formation process, such as deposition thickness and RIE parameters, can be controlled to make the gate conductor 130 in the form of spacer have a width of about 10-35 nm to that it is located substantially between the underlying source and drain regions formed as described above. For example, the gate conductor 130 may comprise a metal gate conductor material, such as Ti, Co, Ni, Al, W, or any alloy thereof. Preferably, there may be a work function adjustment layer 128 sandwiched between the gate dielectric layer 126 and the gate conductor 130. For example, the work function adjustment layer 128 may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, $RuO_x$, or any combination thereof, with a thickness of about 2-10 nm. The gate dielectric layer 126 and the work function adjustment layer 128 shown in FIG. 11 have been selectively etched with the gate conductor 130 as a mask.

Figure 12:
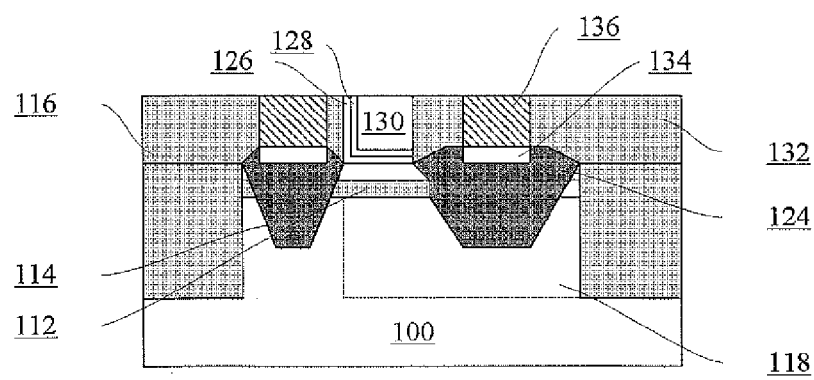

After that, as shown in FIG. 12, an interlayer dielectric layer 132 can be formed by means of e.g. deposition, and planarized by means of, e.g., CMP. The interlayer dielectric layer 132 may comprise oxide (e.g., silicon oxide), nitride or any combination thereof. Then, contacts 136 corresponding to the source and drain regions can be formed. For example, the contacts 136 may comprise metal such as W or Cu. According to an embodiment, to improve the ohmic contact, a metal silicide layer 134 may be formed in the source and drain regions, so that the contacts 136 are in electrical contact with the source and drain regions via the metal silicide layer 134. For example, the metal silicide layer 134 may comprise NiPtSi. There are various ways to form the metal silicide layer 134 and the contacts 136, and detailed descriptions thereof are omitted here Thus, an illustrative semiconductor device according to the present disclosure is achieved. As shown in FIG. 12, the semiconductor device may be formed on an arrangement of the substrate+the buried insulator layer+the semiconductor layer (which is similar to an SOI substrate), and may comprise the source and drain regions (114, 124) and the gate stack (126, 128, 130). The buried insulator layer 112 may comprise the insulating material in the gap sandwiched between the source region and the drain region. The gap can be defined by the sacrificial layer, for example. The gate stack, especially, the gate conductor 130, is formed in the form of spacer on the sidewall of the cover layer (or, a dielectric layer) 116 on one side (the left side in the example shown in FIG. 12) of the gate stack. The source and drain regions 114 and 124 may be stressed. According to an embodiment of the present disclosure, the semiconductor device may further comprise a gate spacer surrounding the gate stack. According to a further embodiment, the semiconductor device may comprise the asymmetric well 118 formed in the substrate and extending away from the source or drain region on said one side (the left side in the example shown in FIG. 12) of the gate stack. According to a further embodiment, the asymmetric well may be located in the source region. In this case, it is possible to effectively suppress the punch-through effects of the device and the band-to-band leakage.

It is to be noted that profile and formation of the first and second cover layers are not limited to the above examples. For example, it is not necessary that the first cover layer exposes the left-side portion of the active region as shown in FIG. 2. Instead, it can expose a right-side portion of the active region. Further, in the arrangement shown in FIG. 6, the first cover layer can be removed, but not in its entirety, so that a portion thereof can be reserved on the sidewall of the second cover sub-layer, similar to the spacer shown in FIG. 8 (in which case, though, it is impossible to manufacture the asymmetric well shown in FIG. 7). Further, in the arrangement shown in FIG. 10, the spacer can be removed, but not in its entirety, so that a portion thereof can be reserved on the sidewall of the second cover sub-layer. This portion of the spacer can serve as a gate spacer for the later formed gate stack.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a semiconductor device, comprising:
    sequentially forming a sacrificial layer and a semiconductor layer on a substrate;
    forming a first cover layer on the semiconductor layer, which exposes a first portion of a surface of the semiconductor layer;
    forming an opening extending into the substrate with the first cover layer as a mask;
    selectively removing at least a portion of the sacrificial layer through the opening, and
    filling an insulating material in a gap due to removal of the sacrificial layer;
    forming one of source and drain regions in the opening with the first cover layer as a mask;
    forming a second cover layer on the substrate, which exposes a second portion of the surface of the semiconductor layer different from the first portion;
    forming the other of the source and drain regions with the second cover layer as a mask;
    removing a portion of the second cover layer to further expose a third portion of the surface of the semiconductor layer in addition to the second portion; and
    forming a gate dielectric layer, and forming a gate conductor in a form of spacer on a sidewall of a remaining portion of the second cover layer.

2. The method according to claim 1, wherein forming the second cover layer comprises:
    forming a second cover sub-layer on the substrate, and planarizing the second cover sub-layer to expose the first cover layer;
    removing the first cover layer; and
    forming a spacer on a sidewall of the second cover sub-layer,
    wherein the second cover sub-layer and the spacer form the second cover layer.

3. The method according to claim 2, wherein after removing the first cover layer and before forming the spacer on the sidewall of the second cover sub-layer, the method further comprises:
    performing well implantation with the second cover sub-layer as a mask.

4. The method according to claim 2, wherein removing the portion of the second cover layer comprises:
    removing at least a portion of the spacer.

5. The method according to claim 1, wherein forming the one of source and drain regions in the opening comprises:
    epitaxially growing a semiconductor material in the opening, the semiconductor material being able to apply stress to the semiconductor layer.

6. The method according to claim 5, wherein forming the other of source and drain regions comprises:
    forming a further opening extending into the substrate with the second cover layer as a mask; and
    epitaxially growing the semiconductor material in the further opening, the semiconductor material being able to apply the stress to the semiconductor layer.

7. The method according to claim 2, wherein
    the first cover layer comprises nitride,
    the second cover sub-layer comprises oxide, and
    the spacer comprises nitride.

8. A semiconductor device, comprising:
    a substrate;
    a buried insulating layer on the substrate;
    a semiconductor layer on the buried insulating layer; and
    source and drain regions formed on the substrate and a gate stack formed on the semiconductor layer,
    wherein the gate stack comprises:
        a gate dielectric layer; and
        a gate conductor, which is formed in the form of spacer on a sidewall of a dielectric layer or a gate spacer being adjacent to the gate stack,
        wherein the gate conductor has a first sidewall facing the dielectric layer or the gate spacer and a bottom surface thereof covered by the gate dielectric layer, and a second sidewall opposite to the first sidewall covered by a further dielectric layer different from the gate dielectric layer.

9. The semiconductor device according to claim 8, wherein the buried insulating layer comprises an insulating material in a gap sandwiched between the source and drain regions.

10. The semiconductor device according to claim 8, wherein each of the source and drain regions comprises a filler of a semiconductor material extending into the substrate, the semiconductor material being able to apply stress to the semiconductor layer.

11. The semiconductor device according to claim 8, further comprising an asymmetric well formed in the substrate and extending away from the source or drain region on one side of the gate stack.

12. The semiconductor device according to claim 9, wherein the substrate and the semiconductor layer comprise Si.

13. The semiconductor device according to claim 10, wherein the filler comprises SiGe or Si:C.

14. The semiconductor device according to claim 9, wherein the insulating material comprises oxide.

15. The semiconductor device according to claim 8, further comprising a work function adjustment layer between the gate dielectric layer and the gate conductor.

16. The method according to claim 1, wherein said forming a sacrificial layer and a semiconductor layer, said forming a first cover layer, said forming an opening, said selectively removing at least a portion of the sacrificial layer, said forming one of source and drain regions, said forming a second cover layer, said forming the other of the source and drain regions, said removing a portion of the second cover layer, and said forming a gate dielectric layer and forming a gate conductor are performed in this sequence.

17. The method according to claim 1, wherein the gate dielectric layer and the gate conductor are formed substantially on the third portion of the surface of the semiconductor layer.

18. The method according to claim 1, wherein the first portion, the second portion, and the third portion together define an active region for the semiconductor device, and the first and second portions are on opposite sides of the third portion.

19. The semiconductor device according to claim 8, wherein the bottom surface of the gate conductor faces a channel defined between the source and drain regions via the gate dielectric layer.

20. The semiconductor device according to claim 8, wherein the first sidewall is on the same side as one of the source and drain regions with respect to the gate stack, and the second sidewall is on the same side as the other of the source and drain regions with respect to the gate stack.

* * * * *